US008633451B2

(12) United States Patent
Ward et al.

(10) Patent No.: US 8,633,451 B2
(45) Date of Patent: Jan. 21, 2014

(54) ION SOURCES, SYSTEMS AND METHODS

(75) Inventors: Billy W. Ward, Boyce, LA (US); Colin A. Sanford, Atkinson, NH (US); John Notte, IV, Gloucester, MA (US); Alexander Groholski, Salem, MA (US); Mark D. DiManna, Fremont, NH (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 141 days.

(21) Appl. No.: 12/999,731

(22) PCT Filed: Jun. 20, 2008

(86) PCT No.: PCT/US2008/067718
§ 371 (c)(1),
(2), (4) Date: Jun. 3, 2011

(87) PCT Pub. No.: WO2009/154631
PCT Pub. Date: Dec. 23, 2009

(65) Prior Publication Data
US 2012/0241640 A1    Sep. 27, 2012

(51) Int. Cl.
*H01J 37/08* (2006.01)
(52) U.S. Cl.
USPC ........................................ 250/423 R; 250/424
(58) Field of Classification Search
None
See application file for complete search history.

(56) References Cited

U.S. PATENT DOCUMENTS

| 4,139,773 | A | * | 2/1979 | Swanson | 250/423 R |
| 4,638,209 | A | * | 1/1987 | Asamaki et al. | 313/359.1 |
| 5,914,493 | A | * | 6/1999 | Morita et al. | 250/492.2 |
| 5,986,270 | A | * | 11/1999 | Bormans et al. | 250/442.11 |
| 8,044,370 | B2 | * | 10/2011 | Winkler et al. | 250/423 F |
| 2006/0226753 | A1 | * | 10/2006 | Adamec et al. | 313/310 |
| 2007/0158558 | A1 | | 7/2007 | Ward et al. | |

FOREIGN PATENT DOCUMENTS

| EP | 2031633 | 3/2009 |
| JP | 7282759 | 10/1995 |
| JP | 2000-05944 | 5/2000 |
| JP | 2009289670 A | * 12/2009 |

OTHER PUBLICATIONS

Hanson et al ("H2 and rare gas field ion source with high angular current" Journal of Vacuum Science and Technology, New York, NY, US, vol. 16, No. 6, Nov. 1, 1979, pp. 1875-1878, XP007903682 ISSN: 0022-5355).*

Marquardt et al., "Cryogenic Material Properties Database," 11$^{th}$ International Cryocooler Conference, Jun. 20-22, 2000, Keystone, CO.

Hanson et al., "H2 and rare gas field ion source with high angular current," *J. Vacuum Sci and Tech*, New York, NY, vol. 16, No. 6, Nov. 1, 1979, pp. 1875-1876.

Tomaru et al., "Thermal lensing in an cryogenic sapphire substrates," Classical and Quantum Gravity IOP Publishing UK, vol. 19, No. 7, Apr. 2002, pp. 2045-2049.

The International Search Report and Written Opinion for corresponding PCT Appl No. PCT/US2008/067718, dated Jun. 30, 2009.

* cited by examiner

*Primary Examiner* — Andrew Smyth
(74) *Attorney, Agent, or Firm* — Fish & Richardson P.C.

(57) ABSTRACT

Ion sources, systems and methods are disclosed. In some embodiments, the ion sources, systems and methods can exhibit relatively little undesired vibration and/or can sufficiently dampen undesired vibration. This can enhance performance (e.g., increase reliability, stability and the like).

18 Claims, 6 Drawing Sheets

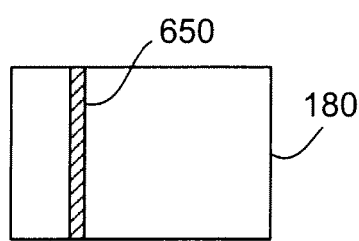
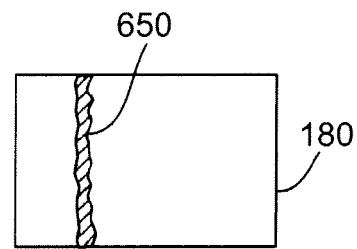
FIG. 5A  FIG. 5B
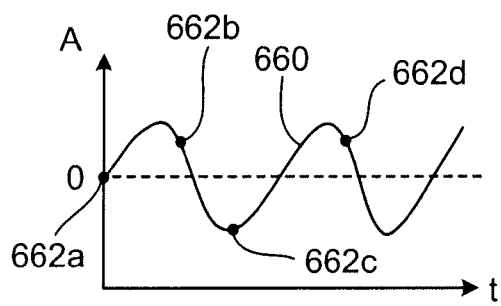
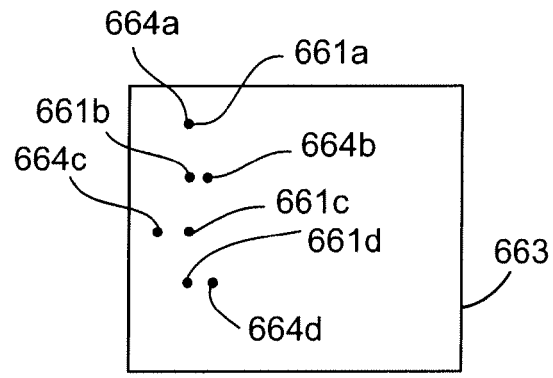
FIG. 6A  FIG. 6B
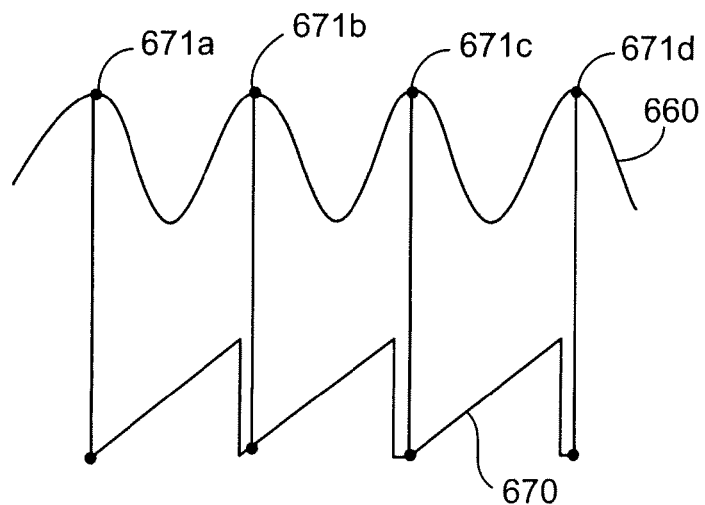
FIG. 7

ION SOURCES, SYSTEMS AND METHODS

TECHNICAL FIELD

This disclosure relates to ion sources, systems, and methods.

BACKGROUND

Ion sources and systems can produce ion beams which are used to investigate and/or modify a sample.

SUMMARY

In some embodiments, the ion sources, systems and methods can exhibit relatively little undesired vibration and/or can sufficiently dampen undesired vibration. This can enhance performance (e.g., increase reliability, stability and the like).

In one aspect, the disclosure features a field emission charged particle source that includes: (a) an outer structure mounted to a carrying structure being at environmental temperature; (b) an intermediate structure mounted to the outer structure; (c) an inner structure mounted to the intermediate structure; (d) a charged particle emitter mounted to the inner structure; and (e) a cooling device thermally connected to the intermediate structure. The outer structure is made of a material having at cryostatic temperature a lower thermal conductivity than the material of the inner structure.

In another aspect, the disclosure features a field emission charged particle source that includes: (a) an outer structure mounted to a carrying structure being at environmental temperature, the outer structure having a thermal conductivity; (b) an intermediate structure mounted to the outer structure; (c) an inner structure mounted to the intermediate structure; (d) a field emitter mounted to the inner structure; and (e) a cooling device thermally connected to the intermediate structure. The intermediate structure has a thermal capacity which is larger than 1.5 times the thermal conductivity of the outer structure.

In a further aspect, the disclosure features a gas field beam system that includes: (a) a field emitting source generating a beam of charged particles with a main direction of propagation; (b) a cooler thermally connected to the field emitter or a structure to which the field emitter is mounted; (c) a scanning system by the aid of which a beam generated by the field emission source can be deflected in direction perpendicular to the main direction of propagation; and (d) a control system for operating the field emission system, the control system providing at least a first and a second mode of operation. In the first mode of operation the cooler is operated to cool the field emitter, and in the second mode of operation the cooler is switched off and the scanning system is operated so that beam is deflected to scan a sample.

In another aspect, the disclosure features a gas field beam system that includes: (a) a field emitting source generating a beam of charged particles with a main direction of propagation; (b) a cooler thermally connected to the field emitter or a structure to which the field emitter is mounted; (c) a scanning-system by the aid of which a beam generated by the field emission source can be deflected in direction perpendicular to the main direction of propagation; and (d) a control system for operating the field emission system, the control system providing at least a first and a second mode of operation. In the first mode of operation the cooler is operated to cool the field emitter, and in the second mode of operation the cooler is switched off and the scanning system is operated so that beam is deflected to scan a sample.

In a further aspect, the disclosure features a method that includes exposing a sample to a charged particle beam generated by a tip of a charged particle system, where during exposure of the sample, a constant phase is maintained between a vibrational displacement function of the tip and corresponding portions of an exposure pattern of the charged particle beam on the sample.

In another aspect, the disclosure features a system that includes a tip configured to cause ionization of gas particles to form an ion beam, the tip being mounted on a support structure, and a vibrational damper connected to the support structure and to a cooling device, where the vibrational damper includes a first plurality of flexible members connected to the support structure, a second plurality of flexible members connected to the cooling device, and a solid member disposed between the first and second pluralities of flexible members.

In a further aspect, the disclosure features an ion microscope system that includes a first member that includes a first curved surface, and a second member connected to a tip and including a second curved surface complementary to the first curved surface and configured to permit relative motion between the first and second members, where the second curved surface includes a plurality of annular protrusions, and where when the first and second members are drawn together, at least some of the annular protrusions contact the first curved surface to form annular contact regions between the first and second surfaces.

Embodiments can include one or more of the following features.

The outer structure can have a first wall thickness and the inner structure can have a second wall thickness, where the first wall thickness is smaller than the second wall thickness.

The inner structure can be made of copper and the outer structure can be made of stainless steel.

The outer structure can have a cylindrical shape with a first diameter and the inner structure can have a cylindrical shape with a second diameter, the second diameter being smaller than the first diameter.

The cooling device can be thermally connected to the intermediate structure along a first bundle of thermally conducting, flexible wires. The cooling device can be connected to the intermediate structure along a second bundle of flexible wires and along one or more rigid rods, where the one or more rigid rods are arranged, in series, between the first and the second bundle of thermally conductive flexible wires. The first and/or the second bundle of flexible wires can be made of copper. The first and/or the second bundle of flexible wires can be made of a carbonated pitch material. The rigid rod can include copper.

The charged particle source can include an extraction electrode electrically isolated from the field emitter and where, in operation, a high voltage is applied between the field emitter and the extraction electrode.

The field emitter can be mounted to the inner structure via a material with a thermal conductivity which is higher than the thermal conductivity of the material of the outer structure.

The field emission charged particle source can include a gas conducting tube for feeding a gas to a region within the inner structure, the gas conducting tube terminating in an intermediate region between the outer and the inner structure, and the inner structure comprising holes to provide a gas flow from the intermediate region to a region surrounded by the inner structure.

The field emission charged particle source can include a control by which the cooling device can be switched off for a defined period of time.

The cooling device can be thermally connected to the intermediate structure isothermically.

The inner structure can be a cylinder, where the intermediate structure has the form of a ring and where the cooling device is thermally connected to the intermediate structure along a series of connection regions which are arranged along the intermediate structure.

The outer structure can be made of a material having at cryostatic temperature a lower thermal conductivity than the material of the inner structure.

The details of one or more embodiments are set forth in the accompanying drawings and the description below. Other features and advantages will be apparent from the description, drawings, and claims.

DESCRIPTION OF DRAWINGS

FIGS. 5A and 5B are schematic diagrams of images of a line of material on a sample surface.

FIG. 6A is a schematic diagram of the vibrational amplitude of a tip.

FIG. 6B is a schematic diagram of a sample image.

FIG. 7 is a schematic diagram showing phase-locking of an image scan sequence to a vibrational displacement function of a tip.

Like reference symbols in the various drawings indicate like elements.

DETAILED DESCRIPTION

Introduction

Figure 1:
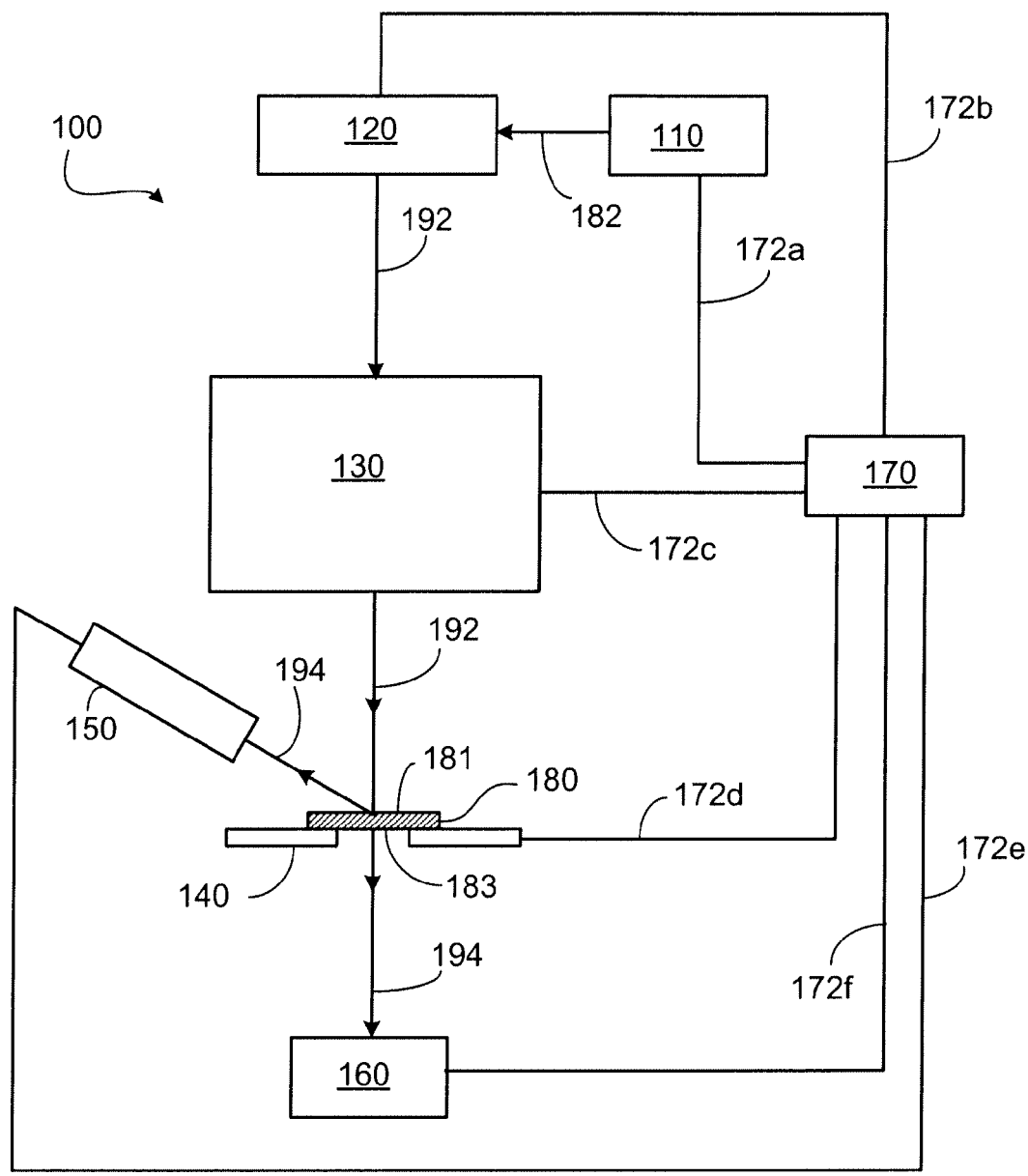
FIG. 1 is a schematic diagram of an ion microscope system.

When used to investigate properties of various samples, ion beams can provide qualitative and/or quantitative measurements that are precise and accurate to atomic resolution. Sample images measured with an ion beam (e.g., images that are derived from measurements of secondary electrons and/or scattered ions and/or scattered neutral atoms) can have very high resolution, revealing sample features that are difficult to observe using other imaging techniques. Optionally, ion beams can be used to provide qualitative and/or quantitative material constituent information about a sample.

An example of a sample is a semiconductor article. Semiconductor fabrication typically involves the preparation of an article (a semiconductor article) that includes multiple layers of materials sequentially deposited and processed to form an integrated electronic circuit, an integrated circuit element, and/or a different microelectronic device. Such articles typically contain various features (e.g., circuit lines formed of electrically conductive material, wells filled with electrically non-conductive material, regions formed of electrically semiconductive material) that are precisely positioned with respect to each other (e.g., generally on the scale of within a few nanometers). The location, size (length, width, depth), composition (chemical composition) and related properties (conductivity, crystalline orientation, magnetic properties) of a given feature can have an important impact on the performance of the article. For example, in certain instances, if one or more of these parameters is outside an appropriate range, the article may be rejected because it cannot function as desired. As a result, it is generally desirable to have very good control over each step during semiconductor fabrication, and it would be advantageous to have a tool that could monitor the fabrication of a semiconductor article at various steps in the fabrication process to investigate the location, size, composition and related properties of one or more features at various stages of the semiconductor fabrication process. As used herein, the term semiconductor article refers to an integrated electronic circuit, an integrated circuit element, a microelectronic device or an article formed during the process of fabricating an integrated electronic circuit, an integrated circuit element, a microelectronic device. In some embodiments, a semiconductor article can be a portion of a flat panel display or a photovoltaic cell. Regions of a semiconductor article can be formed of different types of material (electrically conductive, electrically non-conductive, electrically semiconductive). Exemplary electrically conductive materials include metals, such as aluminum, chromium, nickel, tantalum, titanium, tungsten, and alloys including one or more of these metals (e.g., aluminum-copper alloys). Metal silicides (e.g., nickel silicides, tantalum silicides) can also be electrically conductive. Exemplary electrically non-conductive materials include borides, carbides, nitrides, oxides, phosphides, and sulfides of one or more of the metals (e.g., tantalum borides, tantalum gennaniums, tantalum nitrides, tantalum silicon nitrides, and titanium nitrides). Exemplary electrically semiconductive materials include silicon, germanium and gallium arsenide. Optionally, an electrically semiconductive material can be doped (p-doped, n-doped) to enhance the electrical conductivity of the material. Typical steps in the deposition/processing of a given layer of material include imaging the article (e.g., to determine where a desired feature to be formed should be located), depositing an appropriate material (e.g., an electrically conductive material, an electrically semiconductive material, an electrically non-conductive material) and etching to remove unwanted material from certain locations in the article. Often, a photoresist, such as a polymer photoresist, is deposited/exposed to appropriate radiation/selectively etched to assist in controlling the location and size of a given feature. Typically, the photoresist is removed in one or more subsequent process steps, and, in general, the final semiconductor article desirably does not contain an appreciable amount of photoresist.

FIG. 1 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

Figure 2:
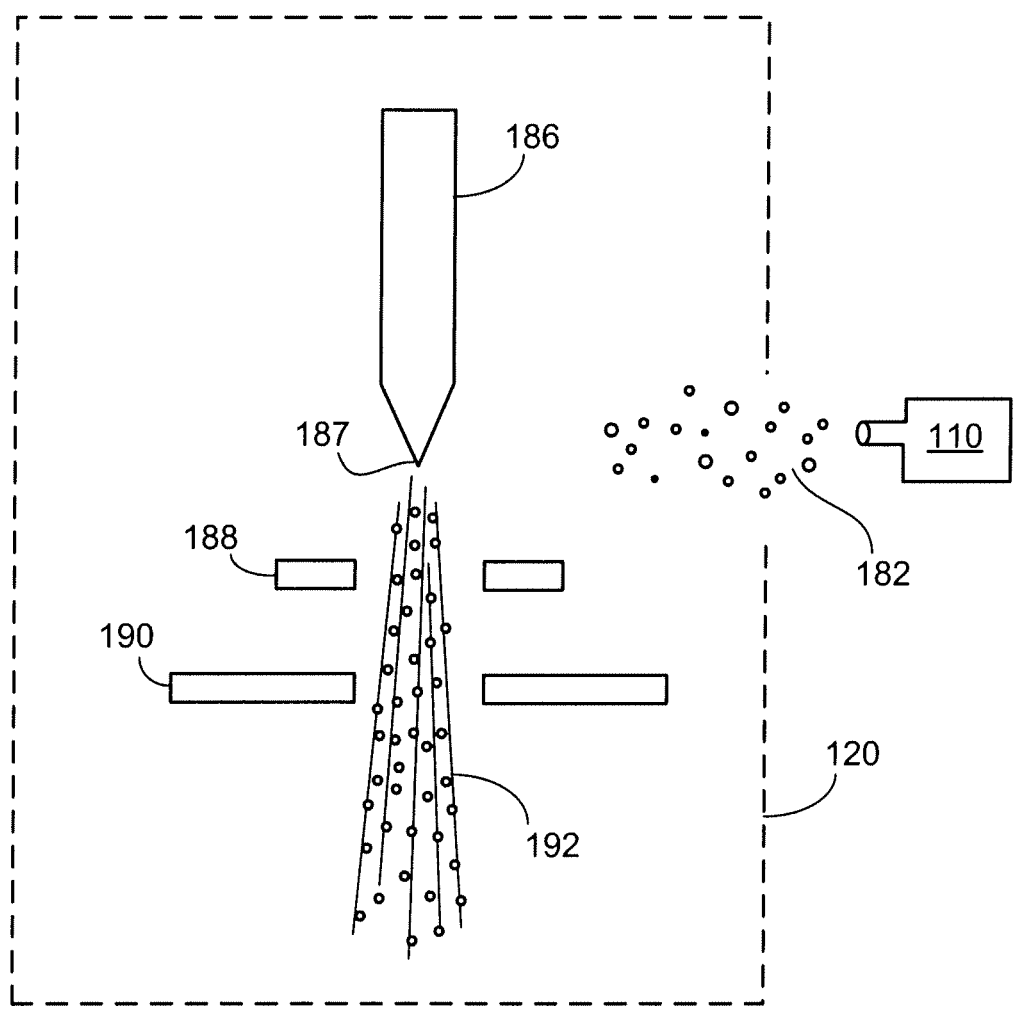
FIG. 2 is a schematic diagram of a gas field ion source.

As shown in FIG. 2, gas source 110 is configured to supply one or more gases 182 to gas field ion source 120. Gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192. In general, as measured at surface 181 of sample 180, the current of ions in ion beam 192 increases monotonically as the pressure of the noble gas in system 100 increases. In certain embodiments, this relationship can be described by a power law where, for a certain range of noble gas pressures, the current increases generally in proportion to gas pressure.

Optionally, gas source 110 can supply one or more gases in addition to the noble gas(es); an example of such a gas is nitrogen. Typically, while the additional gas(es) can be present at levels above the level of impurities in the noble gas(es), the additional gas(es) still constitute minority components of the overall gas mixture introduced by gas source 110.

Gas field ion source 120 is configured to receive the one or more gases 182 from gas source 110 and to produce gas ions from gas(es) 182. Gas field ion source 120 includes an electrically conductive tip 186 with a tip apex 187, an extractor 190 and optionally a suppressor 188.

Electrically conductive tip 186 can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, electrically conductive tip 186 can be formed of an alloy. In some embodiments, electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. Because tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, He ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between He ion beam 192 and sample 180. As shown in FIG. 1, detector 150 is positioned to detect particles 194 that originate primarily from surface 181 of sample 180, and detector 160 is positioned to detect particles 194 that emerge primarily from surface 183 of sample 180 (e.g., transmitted particles). As described in more detail below, in general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of at given particle). Optionally, combinations of such detector arrangements can be used.

In general, the information measured by the detectors is used to determine information about sample 180. Typically, this information is determined by obtaining one or more images of sample 180. By rastering ion beam 192 across surface 181, pixel-by-pixel information about sample 180 can be obtained in discrete steps. Detectors 150 and/or 160 can be configured to detect one or more different types of particles 194 at each pixel.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, material constituent information, crystalline information, voltage contrast information, optical property information, magnetic information), which can optionally be in the form of an image, a graph, a table, a spreadsheet, or the like. Typically, electronic control system 170 includes a user interface that features a display or other kind of output device, an input device, and a storage medium.

In certain embodiments, electronic control system 170 can be configured to control various properties of ion beam 192. For example, control system 170 can control a composition of ion beam 192 by regulating the flow of gases into gas field ion source 120. By adjusting various potentials in ion source 120 and ion optics 130, control system 170 can control other properties of ion beam 192 such as the position of the ion beam on sample 180, and the average energy of the incident ions.

In some embodiments, electronic control system 170 can be configured to control one or more additional particle beams. For example, in certain embodiments, one or more, types of ion beam source and/or electron beam sources can be present. Control system 170 can control each of the particle beam sources and their associated optical and electronic components.

Detectors 150 and 160 are depicted schematically in FIG. 1, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and a microscope system 200 can typically include any desired number of detectors. The configuration of the various detector(s) can be selected in accordance with particles to be measured and the measurement conditions. In some embodiments, a spectrally resolved detector may be used. Such detectors are capable of detecting particles of different energy and/or wavelength, and resolving the particles based on the energy and/or wavelength of each detected particle.

Detection systems and methods are generally disclosed, for example, in U.S. Patent Application Publication No. US 2007/0158558, the entire contents of which are incorporated herein by reference.

Ion Beam Measurements

In general, the accuracy of ion beam measurements depends, in part, on the stability of the ion beam during measurement. For example, fluctuations in the position of the ion beam on the surface of a sample during a measurement can lead to errors in spatially resolved measurements. If such errors are too severe, the suitability of ion beams for certain applications can be unduly limited. Vibrations in ion microscope systems—which can be generated within the system (e.g., via vacuum pumps) or coupled into the system from external sources (e.g., floor vibrations)—can cause the tip to vibrate, producing fluctuations in the position of the ion beam on the sample surface. Accordingly, the ion beam systems disclosed herein include certain features that, at least in part, help to reduce the effects of such vibrations.

Figure 3:
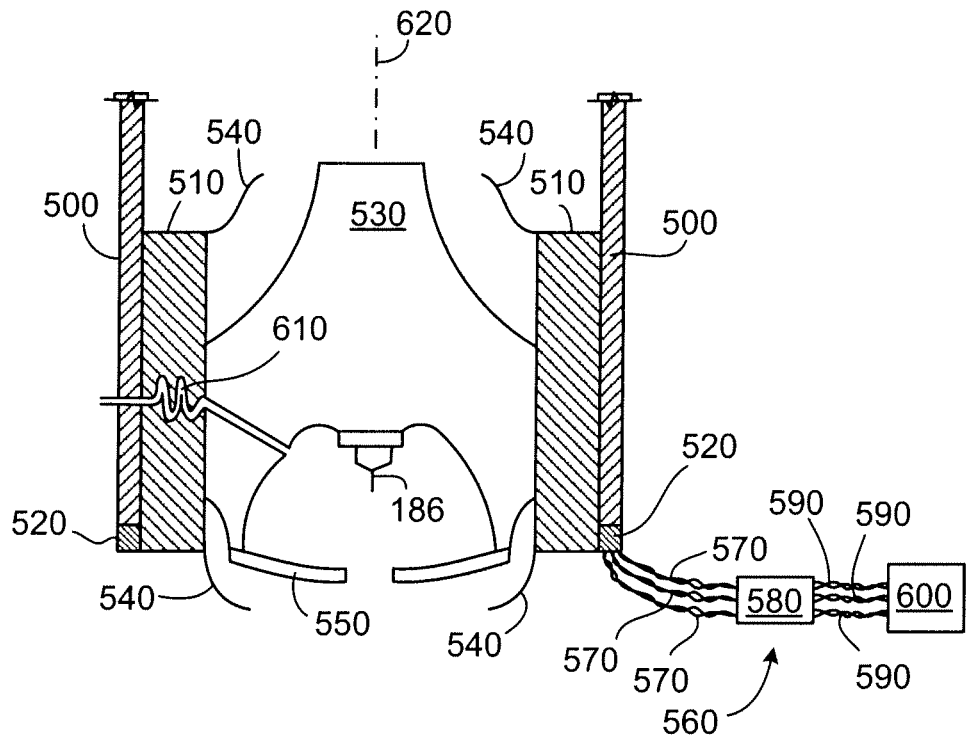
FIG. 3 is a schematic diagram of a portion of an ion microscope system that includes a vibration damper.

FIG. 3 shows a schematic expanded view of a portion of an ion microscope system. The system includes an outer structure 500 (e.g., a vacuum chamber) and an inner structure 510 that contacts outer structure 500. Attached to inner structure 510 is a support 530 that supports a tip 186. During operation, as discussed above, gas particles (e.g., helium gas particles or particles of another noble gas) are ionized in the vicinity of tip 186, and the newly formed ions propagate in a directly approximately parallel to a central axis of outer structure 500. To improve the precision with which newly formed ions are directed along the axis of outer structure 500, extractor 550 is positioned adjacent to tip 186. As discussed above, extractor 550 selects from among the ions produced in the vicinity of tip 186 a certain subset of ions, which form the microscope's ion beam. Further, the system includes radiation shields 540 to prevent stray ions from propagating at large angular deviations within outer structure 500.

The system also includes an intermediate structure 520 that contacts both inner structure 510 and outer structure 500. To cool the system (and particularly tip 186), intermediate structure 520 contacts cooler 600 (e.g., isothermically) through a thermal contact device 560.

In general, intermediate structure 520 contacts both outer structure 500 and inner structure 510, and is therefore capable of cooling both structures. However, it is generally more important that tip 186 be cooled in preference to outer structure 500, because cooling tip 186 to very low temperature can be an important step in operating a field ion microscope.

Tip 186 is mounted on support 530, which is typically formed from a material such as a ceramic material. Support 530 (which can have a thermal conductivity greater than outer structure 500) is in thermal contact with inner structure 510, and therefore, cooler 600 can cool tip 186 by withdrawing heat through support 530, inner structure 510, intermediate structure 520, and thermal contact device 560.

In general, inner structure 510 and outer structure 500 are constructed so that heat flow occurs more readily between inner structure 510 and intermediate structure 520 (and, ultimately, to cooler 600) than between outer structure 500 and cooler 600. In some embodiments, for example, inner structure 510 is formed from a material (e.g., copper, oxygen-free high conductivity copper) that has a higher thermal conductivity than a material such as stainless steel from which outer structure 500 is formed. The thermal conductivity of inner structure 510 can be larger than the thermal conductivity of outer structure 500 by a factor of 1.1 or more (e.g., 1.3 or more, 1.5 or more, 1.7 or more, 2.0 or more, 2.5 or more, 3.0 or more, 3.5 or more, 4.0 or more, 5.0 or more, 10.0 or more, 100 or more, 1000 or more). The thermal conductivity of inner structure 510 can be larger than the thermal conductivity of outer structure 500 at room temperature, for example, and/or at temperatures less than room temperature, including liquid nitrogen temperature and/or liquid helium temperature.

Outer structure 500, in the embodiment shown in FIG. 3, has a cylindrical shape with a central axis 620. Inner structure 510 has a similar cylindrical shape and shares a common central axis. In general, the shapes of inner structure 510 and outer structure 500 can be selected as desired for particular applications and to accommodate differently-shaped tips.

The thicknesses of each of outer structure 500 and inner structure 510 are measured along a direction perpendicular to axis 620 in FIG. 3. In general, the thicknesses of these structures can be selected to ensure that the thermal capacity of inner structure 510 is larger than the thermal capacity of outer structure 500. Accordingly, in certain embodiments, the thickness of inner structure 510 can be larger than the thickness of outer structure 500 by a factor of 1.1 or more (e.g., 1.2 or more, 1.3 or more, 1.5 or more, 2.0 or more, 2.5 or more, 3.0 or more, 3.5 or more, 4.0 or more, 4.5 or more, 5.0 or more, 6.0 or more, 7.0 or more, 8.0 or more, 10.0 or more).

Typically, during operation, ions generated by tip 186 are directed to be incident on a sample, and particles leaving the sample in response to the incident ions are measured to determine properties of the sample (e.g., to obtain one or more images of the sample). During this process, vibrations introduced by cooler 600 into the system can introduce errors into the measured results. To reduce the amplitude of vibrations introduced by cooler 600 into the system, cooler 600 can be turned off during exposure of the sample to the ion beam generated by tip 186. For example, in some embodiments, cooler 600 can be operated to cool tip 186 to a particular operating temperature, and then cooler 600 can be turned off for a period of one minute or more (e.g., two minutes or more, three minutes or more, five minutes or more, seven minutes or more, nine minutes or more, 11 minutes or more, 13 minutes or more, 15 minutes or more, 20 minutes or more) while the sample is exposed to the ion beam and particles leaving the sample are measured. Intermediate structure 520 is typically formed from a material with a high thermal conductivity such as copper, and forms a type of "thermal battery" so that intermediate structure 520 acts as a cooling reservoir when cooler 600 is turned off. In this way, the temperature increase of tip 186 can be limited, in certain embodiments, to a few degrees K or less when cooler 600 is turned off.

The system includes thermal contact device 560, as shown in FIG. 3. Thermal contact device 560 includes a first plurality of flexible contact members 570 that are connected to intermediate support 520 on one end, and to central member 580 on the other end. A second plurality of flexible contact members 590 connects central member 580 to cooler 600. One central member 580 is shown in FIG. 3 but in general, any number (e.g., two or more, three or more, four or more, or even more) of central members 580 can be used.

Thermal contact device 560 provides a conduit for heat transfer between cooler 600 and intermediate structure 520. Thus, flexible contact members 570 and 590 and central member 580 are typically formed from one or more materials with relatively high thermal conductivity, such as copper. Other materials from which some or all of contact members 570 and 590 and central member 580 can be formed include carbon-based materials such as carbonaceous pitch, silver, and/or gold. In some embodiments, for example, flexible contact members 570 and/or 590 can be formed from large numbers of small diameter, flexible strands of one or more thermally conductive materials such as copper, that are woven and/or wrapped around one another to form rope-like braids corresponding to contact members 570 and/or 590.

Thermal contact device 560 functions as a vibration damper, reducing the amplitude of vibrations transmitted to structures 500, 510, and 520 (and also support 530 and tip 186) from cooler 600. By forming contact members 570 and 590 from flexible materials, vibration transfer through these materials is reduced relative to vibration transfer through more rigid materials. Further, central member 580 acts as a type of pendulum to counteract vibrations that are coupled into flexible contact members 590 from pump 600.

In general, the geometric properties of flexible contact members 570 and 590 and central member 580 are selected to counteract the vibrational properties of cooler 600. In particular, by selecting and/or changing the geometric properties of contact members 570 and 590 and/or central member 580, the damping ability of thermal contact device 560 can be specifically tuned to a resonance frequency of cooler 600 (or higher harmonics thereof). Typically, for example, cooler 600 has a harmonic resonance frequency of about 46 Hz, and thermal contact device 560 can be tuned to damp high frequency vibrations at multiple harmonics of this resonance frequency (e.g., second harmonic and higher, third harmonic and higher, fourth harmonic and higher, fifth harmonic and higher, sixth harmonic and higher, eighth harmonic and higher, tenth harmonic and higher).

The damping ability of thermal contact device 560 can be tuned several ways. Generally, thermal contact device 560 has an effective band of damping frequencies that includes a central damping frequency which depends, in part, on the mass of central member 580 and an effective harmonic spring constant of contact members 570. In certain embodiments, to tune the central damping frequency of thermal contact device 560, the position of central member 580 can be selected and/or changed relative to contact members 570 and 590 (e.g., to change the lengths of contact members 570). By changing the lengths of contact members 570, the effective spring constant of these members can be changed, altering the central damping frequency of device 560. In general, shortening the length of contact members 570 makes the members stiffer, increasing central damping frequency of device 560. Conversely, increasing the length of contact members 570 decreases the central damping frequency of device 560.

In some embodiments, central member 580 is implemented as a solid cylinder, and changing the position of central member 580 relative to contact members 570 and 590 effectively corresponds to shortening or lengthening contact members 570 during fabrication of device 560. In certain embodiments, central member 580 is implemented as a hollow cylinder that slides over contact members 570 and 590 (e.g., contact members 570 and 590 are continuous members), and contact members 570 can be shortened or lengthened by sliding member 580 along the continuous members and then securing member 580 in position (e.g., with a fastener such as a screw).

In some embodiments, the central damping frequency of device 560 can be changed by adjusting the mass of central member 580. In general, increasing the mass of central member 580 leads to a decrease in the central damping frequency of device 560, while decreasing the mass of central member 580 increases the central damping frequency of device 560. The mass of central member 580 can be selected during fabrication of device 560 to compensate a known vibration frequency of cooler 600 (and/or harmonics thereof), for example, and/or the mass of central member 580 can be adjusted following fabrication (e.g., by adding or removing annular strips of material that are concentric with central member 580, not shown in FIG. 3) to tune the central frequency of device 560.

In some embodiments, either or both of contact members 570 and 590 can be shaped to reduce transmission of vibrations by these members. For example, either or both of contact members 570 and 590 can include U-shaped bends between central member 580 and intermediate structure 520 or cooler 600, respectively. The U-shaped bends assist in preventing efficient vibrational amplitude transfer along the lengths of contact members 570 and 590. Each of members 570 and/or 590 can include multiple U-shaped bends, as desired.

In certain embodiments, the central damping frequency of device 560 can be changed by applying an axial rotation to members 570 and/or 590. For example, before attaching members 570 to intermediate support 520, a torsional force can be applied to members 570 to twist the members, so that residual torsional force remains in members 570 after device 560 is mounted between structure 520 and cooler 600. The residual torsional force increases the effective spring constant of members 570, increasing the central damping frequency of device 560.

As shown in FIG. 3, contact members 570 are attached to only one side of intermediate structure 520. Generally, contact members 570 can be attached to structure 520 (and, in some embodiments, to central member 580) using a deformable, thermally conductive material such as indium foil, which fills in gaps in the mating surfaces of contact members 570 and structure 520 and/or central member 580, improving the thermal contact between these surfaces. Similarly, in certain embodiments, contact members 590 can be attached to central member 580 and/or cooler 600 via a deformable material such as indium foil.

To achieve a relatively uniform temperature distribution along the circumference of structure 520, structure 520 is formed from a material that has relatively high thermal conductivity. As shown in FIG. 3, contact members 570 are attached to only one side of structure 520 and thus, if the thermal conductivity of structure 520 is not large enough, a temperature gradient will form along the circumference of structure 520. In some embodiments, to reduce the likelihood of such a gradient forming, contact members 570 can be attached at various points along structure 520.

Figure 4:
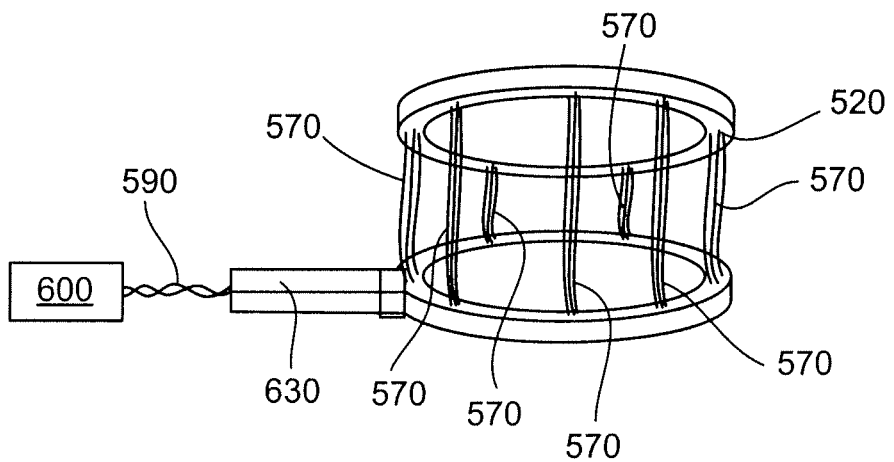
FIG. 4 is a schematic diagram of another embodiment of a vibration damper.

FIG. 4 shows an embodiment in which contact members 570 are spaced at intervals along intermediate structure 520 (the remaining portions of FIG. 3 are not shown, for clarity). Contact members 570 are also joined to a ring member 630, which effectively functions in a similar manner to central member 580 in FIG. 3. Ring member 630 is connected via contact members 590 to cooler 600, for example. By spacing contact members 570 along intermediate structure 520, the magnitude of any thermal gradients formed in intermediate structure 520 can be reduced.

In some embodiments, central member 580 can be attached to a support structure. For example, central member 580 can be connected through a support structure (e.g., wires) to outer structure 500, or to another external structure (an external structure that is positioned on a vibration-damping base, for example, so that it is vibrationally decoupled from cooler 600).

When a sample is imaged by exposing the sample to the ion beam generated by tip 186 and detecting particles that leave the sample as a result of the incident ions, mechanical vibration of tip 186 can lead to imaging errors. FIG. 5A shows a sample 180 that includes a line of material 650 on the sample surface. Line 650 has straight, parallel sides. However, if sample 180 is imaged as tip 186 vibrates (e.g., due to vibrations coupled into tip 186 from cooler 600 and/or other sources), line 650 can appear as shown in FIG. 5B, with wavy, irregular sides.

FIG. 6A shows the amplitude A of mechanical vibration 660 of tip 186 as a function of time t. FIG. 6B shows an image 663 of a sample that is exposed to the ion beam formed by tip 186. Four image pixels 661a-d are shown in FIG. 6B. With reference to FIG. 6A, when pixel 661a is exposed to the ion beam, tip 186 is not vibrationally displaced from its equilibrium position—the vibrational amplitude is zero (position 662a). Accordingly, vibration of tip 186 does not contribute any error to the position measurement of pixel 661a. When pixel 661b is exposed to the ion beam, tip 186 is vibrationally displaced at position 662b from its equilibrium position. Thus, pixel 661b is measured not at its true position, but at position 664a in the image (e.g., positively displaced). When pixel 661c is exposed to the ion beam, tip 186 is vibrationally displaced at position 662c from its equilibrium position, and so pixel 661c in the image appears not at its true position, but at position 664c (e.g., negatively displaced). When pixel 661d is exposed to the ion beam, tip 186 is once again positively displaced from its equilibrium position, and pixel 661d appears in position 664d in the image. By connecting pixels 664a-d in FIG. 6B, it is evident how the waviness and irregularity in the sides of line 650 can be produced.

The imaging irregularities discussed above arise, in part, from the random phase at which pixel data in the image is acquired, relative to the vibrational motion of tip 186. To reduce these irregularities, the pixel scanning pattern of the ion beam on the sample can be phase-locked to the mechanical vibration of tip 186. For example, as shown in FIG. 7, the mechanical vibration amplitude function 660 can be phase locked to the scanning voltage 670 that is applied to scan the ion beam across the surface of the sample. The effect of the phase-locking is to ensure that rather than exposing pixels 661a-d of the image at random vibrational displacements of tip 186 from its equilibrium position, each of pixels 661a-d is exposed with tip 186 at approximately the same vibrational displacement from equilibrium (e.g., at points 671a-d on amplitude function 660). As a result of the phase-locking, dynamic imaging errors that result from phase fluctuations between scans of certain pixels and the vibrational amplitude of tip 186 can be significantly reduced and/or eliminated.

Images can still include static errors, because different pixels (different pixels along a common horizontal line, for example) are sampled at different vibrational displacements of tip 186. In certain embodiments, the images can be corrected (e.g., following acquisition) by applying a pixel-dependent offset that is derived from knowledge and/or estimates of the vibrational displacement of tip 186 from its equilibrium position at each pixel position. Due to the phase-locking between the pixel scanning pattern and the vibrational displacement of the tip, the pixel position measurement errors arise largely from systematic, position-dependent errors rather than random, phase-related errors, and are significantly easier to correct as a result.

In some embodiments, to eliminate both phase-related (e.g., dynamic) and static errors in images, each image pixel can be exposed with tip 186 at a common vibrational displacement. For example, referring to FIG. 7, each pixel in an image of a sample can be exposed when tip 186 is at a position corresponding to position 671a. That is, each pixel can be exposed when tip 186 is maximally displaced in one direction from its equilibrium position. Because the relative phase between each of the image pixels (e.g., not just the first pixel in each row) and the vibrational displacement of tip 186 is the same, each image pixel corresponds to a common vibrational displacement of tip 186 from its equilibrium position. As a result, both dynamic and static errors in the image due to vibration of tip 186 during imaging can be significantly reduced.

Although simple linear raster-scanning of the ion beam on the sample surface has been described above, in general, any scanning pattern can be used. For example, in some embodiments, checkerboard scanning patterns can be used, with the scanning pattern phase-locked to vibrational displacement of tip 186 from its equilibrium position. More sophisticated scanning patterns can also be phase-locked to the vibrational displacement of tip 186 from its equilibrium position as discussed herein.

Figure 8:
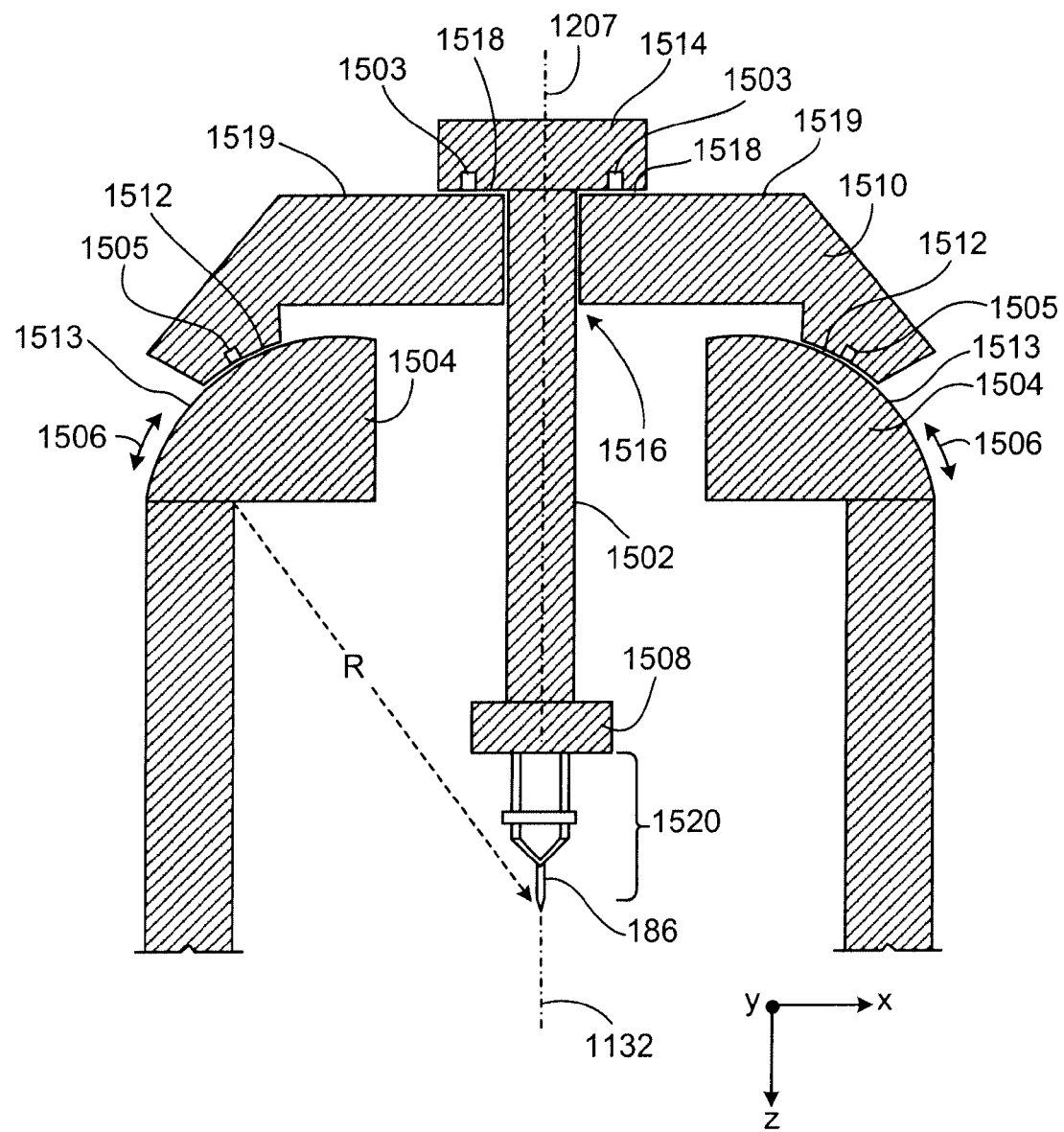
FIG. 8 is a schematic diagram of a tip manipulator.

Another potential source of vibrational instability in the ion microscope system is the tip manipulator, which includes a dome-shaped surface of motion and a translator connected to tip 186, with a mating surface shaped to permit movement along the surface of motion. The tip manipulator permits both translation of tip 186 in the x-y plane, and tilting of tip 186 with respect to axis 1132 of ion optics 130. FIG. 8 is a cross-sectional view of a portion of an ion microscope system including tip 186, support assembly 1520 and an embodiment of a tip manipulator. The tip manipulator includes a shaft 1502, a dome 1504, a shoulder 1510 and a translator 1514. Translator 1514 is connected to shaft 1502, which is dimensioned to fit through an opening 1516 in shoulder 1510. Shaft 1502 is further connected to base 1508, which in turn is connected to assembly 1520. Shoulder 1510 is in a fixed position relative to dome 1504 by static frictional forces between surfaces 1512 and 1513, and translator 1514 is in a fixed position relative to shoulder 1510 by static frictional forces between surfaces 1518 and 1519.

The tip manipulator provides for translation of tip 186 in the x-y plane. To translate tip 186, a high pressure gas is introduced into inlet 1503. The high pressure gas introduced into inlet 1503 can be a gas such as room air, for example. Typically, the gas can be introduced at a pressure of 50 pounds per square inch (psi) or more (e.g., 75 psi or more, 100 psi or more, 125 psi or more). As a result of introducing the high pressure gas, a force is applied to translator 1514 in the −z direction, away from shoulder 1510. The applied force lessens (but does not reduce to zero) the frictional force between surfaces 1518 and 1519, and permits repositioning of translator 1514 with respect to shoulder 1510 by applying a lateral force in the x-y plane. Tip 186 is translated in the x-y plane when translator 1514 is repositioned. When tip 186 is in its new position, the supply of high pressure gas is turned off and strong static frictional forces between surfaces 1518 and 1519 are re-established by evacuating the interior of the tip manipulator using one or more vacuum pumps. Tip 186 is rigidly fixed in position as a result of the re-established strong frictional forces.

The tip manipulator also provides for tilting of tip 186 with respect to axis 1132 of ion optics 130. To tilt tip 186, a high pressure gas is introduced into inlet 1505. The high pressure gas introduced into inlet 1505 can be a gas such as room air, for example. Typically, the gas can be introduced at a pressure of 50 pounds per square inch (psi) or more (e.g., 75 psi or more, 100 psi or more, 125 psi or more). As a result of introducing the high pressure gas, a force is applied to shoulder 1510 in the −z direction, away from dome 1504. The applied force lessens (but does not reduce to zero) the frictional force between surfaces 1512 and 1513. Shoulder 1510 can then be re-positioned with respect to dome 1504 by applying a lateral force to translate shoulder 1510 in a direction indicated by arrows 1506. Translation of shoulder 1510 corresponds to relative movement along the curved surface of dome 1504. As a result of this movement, the angle between axes 1132 and 207 (which corresponds to the tilt angle of tip 186) changes. When adjustment of the tilt of tip 186 is complete, the supply of high pressure gas is turned off and strong static frictional forces between surfaces 1512 and 1513 are re-established by evacuating the interior of the tip manipulator. Tip 186 is rigidly fixed in position as a result of the re-established strong frictional forces.

Figure 9:
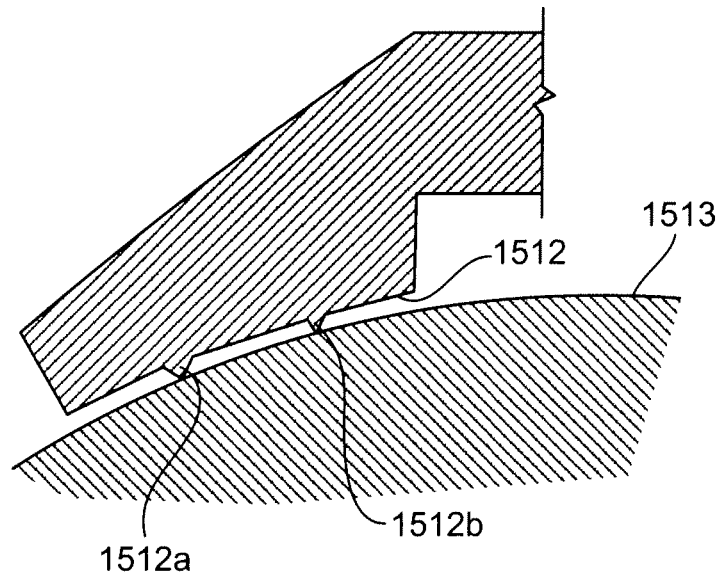
FIG. 9 is a schematic diagram of a portion of a tip manipulator.

If the mating surfaces 1512 and 1513 are not both very smooth, however, small protrusions on either surface can lead to the formation of points of contact at the interface between surfaces 1512 and 1513. In other words, as shown in FIG. 9, instead of an entire annular contact region at the interface between surfaces 1512 and 1513, a small number of contact points 1512a and 1512b exist between the surfaces. As a result, the frictional force which holds tip 186 in place is greatly reduced, and external vibrations can cause undesired motion of tip 186.

Figure 10:
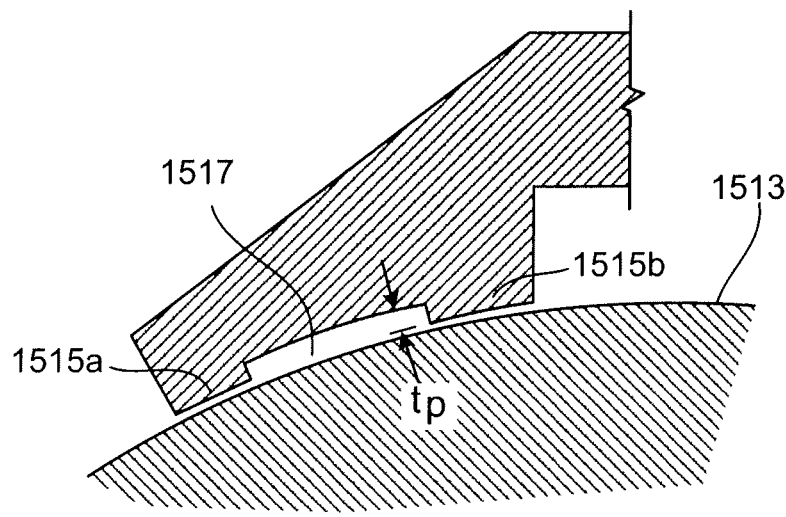
FIG. 10 is a schematic diagram of a portion of a tip manipulator.

To increase the area of contact between surfaces 1512 and 1513 in the presence of surface irregularities such as small protrusions, surface 1512 can include two or more annular protrusions instead of a continuous mating surface, as shown in FIG. 10. Annular protrusions 1515a and 1515b are formed in surface 1512, with a recess 1517 between the surfaces. Each of the protrusions 1515a and 1515b has a thickness $t_p$ measured in a direction normal to the surface of the protrusion.

Typically, the thickness $t_p$ is 1 mm or less (e.g., 800 microns or less, 600 microns or less, 500 microns or less, 400 microns or less, 300 microns or less, 200 microns or less, 100 microns or less, 50 microns or less, 25 microns or less, 10 microns or less). Due to the relatively small thickness of protrusions 1515a and 1515b, when the interior of the tip manipulator is evacuated, the clamping force between shoulder 1510 and dome 1504 causes each of protrusions 1515a and 1515b to deform, establishing two regions of intimate contact with surface 1513. These regions are annular, extending around the curved surface of dome 1504. As a result of the annular contact regions between shoulder 1510 and dome 1504, the frictional force that holds tip 186 in place is greater than in the situation shown in FIG. 9, in which only relatively small points of contact exist between surfaces 1512 and 1513. Accordingly, the stability of tip 186 is improved and the amplitude of the vibrational motion of tip 186 can be reduced.

In the embodiment shown above, surface 1512 includes two protrusions 1515a and 1515b, with a recess 1517 between the protrusions. In general, surface 1512 can include any number of protrusions (e.g., three or more, four or more, five or more, six or more, eight or more, ten or more, or even more). Recesses can be positioned between the protrusions to allow for deformation of the protrusions when the interior of the tip manipulator is evacuated.

In some embodiments, it can be desirable to improve gas utilization (e.g., utilization of a beam-forming gas such as helium) to increase the ion beam current, for example. Low signal-to-noise ratio in sample measurements that are performed with ion beams can limit the suitability of ion beams for certain measurement applications. For example, low signal-to-noise ratios can introduce errors in measurement precision, making such measurements less reliable. When the ion beam is used to obtain images of a sample, certain fine details of the sample surface can be obscured by noise in the acquired images. One method for improving the signal-to-noise ratio in measured images is to increase the ion beam current.

The ion beam current can be increased by using a tip 186 with a slightly larger radius of curvature. Ionization of the gas occurs in the vicinity of the tip apex. By using a tip with a slightly larger radius of curvature, the region of space surrounding tip 186 in which ionization of gas particles can occur is larger. As a result, the ion current in the ion beam can be increased.

Typically, to produce a tip with a larger radius of curvature, the tip is first formed in a fabrication process (suitable fabrication processes are discussed, for example, in U.S. Patent Application Publication No. US 2007/0158558). The fabrication process can be performed in the absence of oxygen gas, to prevent some sharpening of the tip. As a result of the fabrication process, tip 186 typically has a full cone angle of between 30 degrees and 45 degrees.

The radius of curvature of tip 186 is typically 100 nm or more (e.g., 120 nm or more, 140 nm or more, 160 nm or more, 180 nm or more, 200 nm or more). A gas (e.g., helium gas) is introduced through a tube into cooling channels 610 in inner structure 510, where it is pre-cooled before entering the ion microscope system through support 530. Ionization of the gas occurs in the vicinity of tip 186, producing an ion beam which is then directed by extractor 550 (and, more generally, ion optics 130) to propagate along a main direction (e.g., along axis 620 in FIG. 3) and to be incident on a sample.

OTHER EMBODIMENTS

As an example, while embodiments have been described in which a gas field ion source is used, other types of ion sources may also be used. In some embodiments, a liquid metal ion source can be used. An example of a liquid metal ion source is a Ga ion source (e.g., a Ga focused ion beam column).

As another example, while embodiments have been described in which an ion source is used, more generally any charged particle source can be used. In some embodiments, an electron source, such as an electron microscope (e.g., a scanning electron microscope) can be used.

As a further example, while embodiments have been described in which samples are in the form of semiconductor articles, in some embodiments, other types of samples can be used. Examples include biological samples (e.g., tissue, nucleic acids, proteins, carbohydrates, lipids and cell membranes), pharmaceutical samples (e.g., a small molecule drug), frozen water (e.g., ice), read/write heads used in magnetic storage devices, and metal and alloy samples. Exemplary samples are disclosed in, for example, U.S. Patent Publication No. US 2007/0158558.

As an additional example, while embodiments have been described in which a sample is inspected, alternatively or additionally, the systems and methods disclosed herein can be used to modify (e.g., repair) a sample (e.g., to repair a region of the article at or near the portion of the article exposed by the cross-section). Such modification can involve gas assisted chemistry, which can be used to add material to and/or remove material from a sample (e.g., a given layer of the sample). As an example, gas assisted chemistry can be used for semiconductor circuit editing in which damaged or incorrectly fabricated circuits and/or circuit elements formed in semiconductor articles are repaired. Typically, circuit editing involves adding material to a circuit (e.g., to close a circuit that is open) and/or removing material from a circuit (e.g., to open a circuit that is closed). Gas assisted chemistry can also be used in photolithographic mask repair. Mask defects generally include an excess of mask material in a region of the mask where there should be no material, and/or an absence of mask material where material should be present. Thus, gas assisted chemistry can be used in mask repair to add and/or remove material from a mask as desired. Typically, gas assisted chemistry involves the use of a charged particle beam (e.g., ion beam, electron beam, or both) that interacts with an appropriate gas (e.g., $Cl_2$, $O_2$, $I_2$, $XeF_2$, $F_2$, $CF_4$, $H_2O$, $XeF_2$, $F_2$, $CF_4$, $WF_6$). As another example, modification of a sample can involve sputtering. In some instances, when fabricating articles, it can be desirable during certain steps to remove materials (e.g., when removing undesired material from a circuit to edit the circuit, when repairing a mask). An ion beam can be used for this purpose where the ion beam sputters material from the sample. In particular, an ion beam generated via the interaction of gas atoms with a gas field ion source as described herein can be used for sputtering a sample. Although He gas ions may be used, it is typically preferable to use heavier ions (e.g., Ne gas ions, Ar gas ions, Kr gas ions, Xe gas ions) to remove material. During the removal of material, the ion beam is focused on the region of the sample where the material to be removed is located. Examples of such inspection are disclosed, for example, in U.S. Patent Publication No. US 2007/0158558.

Combinations of features disclosed herein can be used in various embodiments. Other embodiments are covered by the claims.

What is claimed is:

1. A field emission charged particle source, comprising:
   an outer structure mounted to a carrying structure being at environmental temperature, the outer structure comprising a material having a thermal conductivity;
   an intermediate structure mounted to the outer structure, the intermediate structure comprising a material having a thermal conductivity;
   an inner structure mounted to the intermediate structure, the inner structure comprising a material having a thermal conductivity;
   a charged particle field emitter mounted to the inner structure; and
   a cooling device thermally connected to the intermediate structure,
   wherein:
      the outer structure comprises a material having a lower thermal conductivity than the material of the inner structure, and/or the material of the intermediate structure has a thermal conductivity that is larger than 1.5 times the thermal conductivity of the material of the outer structure;
      the cooling device is thermally connected to the intermediate structure along a first bundle of thermally conducting, flexible wires; and
      the cooling device is connected to the intermediate structure along a second bundle of flexible wires and along one or more rigid rods.

2. The field emission charged particle source of claim 1, wherein the outer structure has a first wall thickness, the inner structure has a second wall thickness, and the first wall thickness is less than the second wall thickness.

3. The field emission charged particle source of claim 1, wherein the inner structure comprises copper and the outer structure comprises stainless steel.

4. The field emission charged particle source of claim 1, wherein the outer structure has a cylindrical shape with a first diameter, the inner structure has a cylindrical shape with a second diameter, and the second diameter is less than the first diameter.

5. The field emission charged particle source of claim 1, wherein the one or more rigid rods are arranged, in series, between the first and the second bundle of thermally conductive flexible wires.

6. The field emission charged particle source of claim 1, wherein the first and/or the second bundle of flexible wires comprise copper.

7. The field emission charged particle source of claim 1, wherein the first and/or the second bundle of flexible wires comprise a carbonated pitch material.

8. The field emission charged particle source of claim 1, wherein the one or more rigid rods comprise copper.

9. The field emission charged particle source of claim 1, further comprising an extraction electrode electrically isolated from the field emitter.

10. The field emission charged particle source of claim 1, wherein the field emitter is mounted to the inner structure via a material with a thermal conductivity which is greater than the thermal conductivity of the material of the outer structure.

11. The field emission charged particle source of claim 1, further comprising a gas conducting tube configured to feed a gas to a region within the inner structure, wherein the gas conducting tube terminates in an intermediate region between the outer and the inner structures, and the inner structure comprises holes configured to provide a gas flow from the intermediate region to a region surrounded by the inner structure.

12. The field emission charged particle source of claim 11, further comprising a control configured to switch off the cooling device for a defined period of time.

13. The field emission charged particle source of claim 12, wherein the cooling device is thermally connected to the intermediate structure isothermically.

14. The field emission charged particle source of claim 13, wherein the inner structure is a cylinder, the intermediate structure is a ring, and the cooling device is thermally connected to the intermediate structure along a series of connection regions which are arranged along the intermediate structure.

15. The field emission charged particle source of claim 1, wherein the outer structure comprises a material having a lower thermal conductivity than the material of the inner structure.

16. The field emission charged particle source of claim 15, wherein the material of the intermediate structure has a thermal conductivity that is larger than 1.5 times the thermal conductivity of the material of the outer structure.

17. The field emission charged particle source of claim 11, wherein the material of the intermediate structure has a thermal conductivity that is larger than 1.5 times the thermal conductivity of the material of the outer structure.

18. A gas field beam system, comprising:
- a field emission charged particle source according to claim 1, the field emission charged particle being configured to generate a beam of charged particles with a main direction of propagation;
- a scanning system configured to deflect the beam of charged particles in a direction perpendicular to the main direction of propagation; and
- a control system configured to operate the field emission charged particle source, the control system being configured to provide at least a first mode of operation and a second mode of operation, wherein:
- in the first mode of operation, the cooling device is operated to cool the field emitter;
- in the second mode of operation, the cooling device is off; and
- in the second mode of operation, the scanning system is operated so that the beam is deflected to scan a sample.

* * * * *

UNITED STATES PATENT AND TRADEMARK OFFICE
CERTIFICATE OF CORRECTION

| | | |
|---|---|---|
| PATENT NO. | : 8,633,451 B2 | Page 1 of 1 |
| APPLICATION NO. | : 12/999731 | |
| DATED | : January 21, 2014 | |
| INVENTOR(S) | : Billy W. Ward et al. | |

It is certified that error appears in the above-identified patent and that said Letters Patent is hereby corrected as shown below:

Title Page, Col. 2 (Other Publications), delete "Cryongenic" and insert -- Cryogenic --.

In the Specification:

Col. 4, line 29, delete "gennaniums" and insert -- germaniums --.

Col. 6, line 23, delete "at" and insert -- a --.

Signed and Sealed this
Sixth Day of May, 2014

Michelle K. Lee
*Deputy Director of the United States Patent and Trademark Office*